(12) United States Patent
Hayashida et al.

(10) Patent No.: US 7,700,532 B2
(45) Date of Patent: Apr. 20, 2010

(54) CLEANING COMPOSITION AND METHOD OF CLEANING THEREWITH

(75) Inventors: Ichiro Hayashida, Saitama (JP); Hironori Mizuta, Saitama (JP); Takehisa Kato, Saitama (JP)

(73) Assignee: Wako Pure Chemical Industries, Ltd., Osaka-shi (JP)

( * ) Notice: Subject to any disclaimer, the term of this patent is extended or adjusted under 35 U.S.C. 154(b) by 921 days.

(21) Appl. No.: 10/534,351

(22) PCT Filed: Nov. 7, 2003

(86) PCT No.: PCT/JP03/14183

§ 371 (c)(1), (2), (4) Date: Nov. 7, 2005

(87) PCT Pub. No.: WO2004/042811

PCT Pub. Date: May 21, 2004

(65) Prior Publication Data

US 2006/0154838 A1 Jul. 13, 2006

(30) Foreign Application Priority Data

Nov. 8, 2002 (JP) ............................. 2002-324853

(51) Int. Cl.
*C11D 7/32* (2006.01)
(52) U.S. Cl. ....................... 510/175; 134/1.3
(58) Field of Classification Search ................. 510/175; 134/1.3
See application file for complete search history.

(56) References Cited

U.S. PATENT DOCUMENTS

| | | | |
|---|---|---|---|
| 4,537,706 A * | 8/1985 | Severson, Jr. ............... | 510/393 |
| 4,966,630 A * | 10/1990 | Okuda ......................... | 106/426 |
| 5,290,361 A | 3/1994 | Hayashida et al. | |
| 5,302,311 A * | 4/1994 | Sugihara et al. ............. | 510/175 |
| 6,080,709 A | 6/2000 | Ishikawa et al. | |
| 6,143,705 A | 11/2000 | Kakizawa et al. | |
| 6,287,371 B1 * | 9/2001 | Ota et al. .................... | 106/1.18 |
| 6,323,169 B1 * | 11/2001 | Abe et al. .................... | 510/176 |
| 6,514,921 B1 | 2/2003 | Kakizawa et al. | |
| 6,686,322 B1 * | 2/2004 | Nohara et al. ............... | 510/175 |
| 2001/0018407 A1 | 8/2001 | Kakizawa et al. | |
| 2003/0083214 A1 | 5/2003 | Kakizawa et al. | |
| 2003/0158059 A1 * | 8/2003 | Sakai et al. .................. | 510/175 |
| 2004/0142835 A1 * | 7/2004 | Takashima .................. | 510/175 |
| 2006/0151854 A1 * | 7/2006 | Kawase et al. ............... | 257/617 |

OTHER PUBLICATIONS

Patent Abstracts of Japan, Publication No. 05-275405, dated Oct. 22, 1993. Equivalent to US Patent No. 5,290,361.
Patent Abstract of WO 01/71789, dated Sep. 27, 2001. Equivalent to US Patent No. 2003/083214 A1.
Patent Abstracts of Japan, Publication No. 10-072594, dated Mar. 17, 1998. Equivalent to US Patents Nos. 6,143,705, 2001/018407 and 6,514,921.
Patent Abstracts of Japan, Publication No. 11-131093, dated May 18, 1999. Equivalent to US Patent No. 6,080,709.
Patent Abstract of WO 01/97268, dated Dec. 20, 2001. Equivalent to US Patent No. 2003/0158059 A1.
Patent Abstracts of Japan, Publication No. 2002-020787, dated Jan. 23, 2002.
Patent Abstracts of Japan, Publication No. 03-219000, dated Sep. 26, 1991.
Patent Abstracts of Japan, Publication No. 2002-299300, dated Oct. 11, 2002.
Patent Abstracts of Japan, Publication No. 2002-050604, dated Feb. 15, 2002.
Patent Abstracts of Japan, Publication No. 2002-050607, dated Feb. 15, 2002.
Patent Abstracts of Japan, Publication No. 2001-308052, dated Nov. 2, 2001.
Patent Abstracts of Japan, Publication No. 2001-345303, dated Dec. 14, 2001.

* cited by examiner

*Primary Examiner*—Gregory E Webb
(74) *Attorney, Agent, or Firm*—Westerman, Hattori, Daniels & Adrain, LLP

(57) ABSTRACT

The present invention relates to a liquid cleaner for a semiconductor substrate on which metal wiring may be provided, comprising each component of a chelating agent or a salt thereof shown by the following general formula (1), an alkaline compound and pure water, wherein pH is 8 to 13:

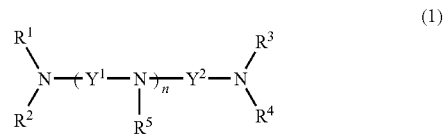

(1)

(wherein, $Y^1$ and $Y^2$ are lower alkylene groups, n is an integer of 0 to 4, at least 4 of $R^1$ to $R^4$ and n $R^5$s are alkyl groups having phosphonic acid group(s) and the rest are alkyl groups) and a cleaning method using the same. The present invention provides a liquid cleaner which can efficiently remove fine particles or impurities derived from various metals at semiconductor substrate surface, even when used after a process adopting an alkaline polishing agent or alkaline etching liquid, without generating problems of causing difficult-to-remove gelled particles at the substrate surface or easy generation of rough semiconductor substrate surface, and a cleaning method using the same.

6 Claims, No Drawings

CLEANING COMPOSITION AND METHOD OF CLEANING THEREWITH

FIELD OF THE INVENTION

The present invention relates to a liquid cleaner for a semiconductor substrate, which may have metal wiring, after polishing treatment, etching treatment, CMP treatment, and the like and a method for cleaning a semiconductor substrate using the same.

BACKGROUND ART

In preparation of semiconductor, various treatments are repeated such as smoothing of silicon wafer substrate surface, etching to laminate various layers on the substrate and smoothing of the surface after lamination.

In each of these treatment processes, fine particles such as polishing particles, impurities derived from various metals and foreign substances derived from slurry adhere to semiconductor substrate surface. It is known that when semiconductor is manufactured leaving these impurities as they are, risk increases for semiconductor finally obtained to be unsatisfactory.

Therefore, a process to a clean semiconductor substrate surface after these various treatment processes, so to speak a cleaning process is performed.

Liquid property (pH) of a liquid cleaner used in this cleaning process is said preferably to have nearly the same degree as in various treatment solutions used in a prior process. That is, too rapid change in pH at substrate surface in cleaning the semiconductor substrate surface causes gelling of particles at the semiconductor substrate surface, which makes removal difficult or easily generates roughness of semiconductor substrate surface. Therefore, it is preferable that a liquid cleaner used after a process, adopting an alkaline polishing agent or an alkaline etching liquid, is an alkaline type.

However, when cleaning is performed using a conventional liquid cleaner (for example, the liquid cleaners disclosed in JP-A-5-275405, WO 01/071789, JP-A-10-072594, JP-A-2002-020787, JP-A-11-131093-, JP-A-3-219000, etc.), ability to remove impurity derived from various metals (metals themselves, oxides thereof, hydroxides thereof, etc.), which are adhered to semiconductor substrate surface, was not sufficient and further improvement has been required.

The present invention is completed considering such problems of conventional technology. The present invention aims at providing an alkaline liquid cleaner which can efficiently remove fine particles or impurities derived from various metals at semiconductor substrate surface, even when used after a process adopting an alkaline polishing agent or alkaline etching liquid, without generating problems of causing difficult-to-remove gelled particles at the substrate surface or easy generation of rough semiconductor substrate surface.

DISCLOSURE OF THE INVENTION

The present invention is composed of the following to attain the above-described objectives:

(1) a liquid cleaner for a semiconductor substrate on which metal wiring may be provided, comprising each component of a chelating agent or a salt thereof shown by the following general formula (1), an alkaline compound and pure water, wherein pH is 8 to 13.

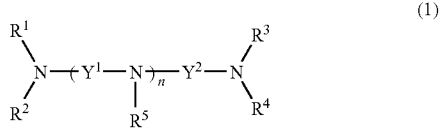

(wherein, $Y^1$ and $Y^2$ are lower alkylene groups, n is an integer of 0 to 4, at least 4 of $R^1$ to $R^4$ and n $R^5$s are alkyl groups having phosphonic acid group(s) and the rest are alkyl groups; and (2) a method for cleaning a semiconductor substrate, which comprises the semiconductor substrate, on which metal wiring may be provided, is cleaned with a liquid cleaner of the above (1).

BEST MODE FOR CARRYING OUT THE INVENTION

A liquid cleaner used in cleaning process contains a chelating agent or a salt thereof shown by the following general formula (1), an alkaline compound and pure water:

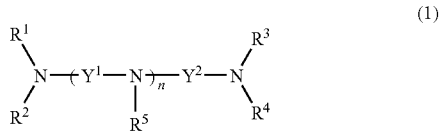

(wherein, $Y^1$ and $Y^2$ are lower alkylene groups, n is an integer of 0 to 4, at least 4 of $R^1$ to $R^4$ and n $R^5$s are alkyl groups having phosphonic acid group(s) and the rest are alkyl groups)

The lower alkylene group here is preferably linear or branched one having 1-4 carbon atoms, and specifically includes, for example, a methylene group, an ethylene group, a propylene group, a methylmethylene group, a methylethylene group, an ethylmethylene group, a butylene group, a methylpropylene group, an ethylethylene group, etc.

The alkyl group in the alkyl group which may have phosphonic acid group(s) is preferably linear or branched one having 1-4 carbon atoms, and specifically includes, for example, a methyl group, an ethyl group, a n-propyl group, an isopropyl group, a n-butyl group, an isobutyl group, a sec-butyl group, a tert-butyl group, etc. Number of phosphonic acid groups which these alkyl groups may have is usually 1 to 2 and preferably 1.

The chelating agent or the salt thereof shown by the general formula (1) is contained to capture and remove metal impurity adhered and remained at semiconductor substrate surface which may have metal wiring, after polishing treatment, etching treatment, CMP treatment, and the like. Metal impurity includes one derived from a transition metal such as iron (Fe), nickel (Ni), copper, etc. and an alkaline earth metal such as calcium (Ca), magnesium (Mg), etc, for example these metals themselves, oxides thereof, hydroxides thereof, etc. The chelating agent or the salt thereof shown by the general formula (1) removes metal impurity by forming stable complex ions with these metals.

The salt of the chelating agent includes an alkaline metal salt such as a lithium salt, a sodium salt, a potassium salt, etc. and an ammonium salt.

The chelating agent or the salt thereof specifically includes ethylenediaminetetraethylenephosophonic acid, ethylenediaminetetraethylenephosophonic acid ammonium salt, ethylenediaminetetraethylenephosophonic acid potassium salt, ethylenediaminetetraethylenephosophonic acid sodium salt, ethylenediaminetetraethylenephosophonic acid lithium salt, ethylenediaminetetramethylenephosophonic acid, ethylenediaminetetramethylenephosophonic acid ammonium salt, ethylenediaminetetramethylenephosophonic acid potassium salt, ethylenediaminetetramethylenephosophonic acid sodium salt, ethylenediaminetetramethylenephosophonic acid lithium salt, diethylenetriaminepentaethylenephosophonic acid, diethylenetriamine pentamethylenephosphonic acid, diethylenetriamine pentamethylenephosphonic acid ammonium salt, diethylenetriamine pentamethylenephosphonic acid potassium salt, diethylenetriamine pentamethylenephosphonic acid sodium salt, diethylenetriamine pentamethylenephosphonic acid lithium salt, triethylenetetramine hexaethylenephosphonic acid, triethylenetetramine hexa(methylenephosphonic acid, triethylenetetramine hexamethylenephosphonic acid ammonium salt, triethylenetetramine hexamethylenephosphonic acid potassium salt, triethylenetetramine hexamethylenephosphonic acid sodium salt, triethylenetetramine hexamethylenephosphonic acid lithium salt, propanediaminetetraethylenephosphonic acid, propanediaminetetramethylenephosphonic acid, propanediaminetetramethylenephosphonic acid ammonium salt, propanediaminetetramethylenephosphonic acid potassium salt, propanediaminetetramethylenephosphonic acid sodium salt, propanediaminetetramethylenephosphonic acid lithium salt, etc. They may be used alone or optionally in combination of two or more compounds.

Among these chelating agents or salts thereof, those shown by the above general formula (1), wherein all of $R^1$ to $R^4$ and n $R^5$s are alkyl groups having phosphonic acid group(s) are preferable due to having high potential to form a complex with metal impurity. In the above general formula (1), "n" is preferably an integer of 0 to 2 in view of production easiness.

More preferable one, therefore, includes at least one kind selected from the group consisting of ethylenediaminetetramethylenephosophonic acid (hereinafter abbreviated as "EDTPO". Names in parenthesis after compound names hereinafter show abbreviated symbols thereof.), ethylenediaminetetramethylenephosophonic acid ammonium salt, ethylenediaminetetramethylenephosophonic acid potassium salt, ethylenediaminetetramethylenephosophonic acid sodium salt, ethylenediaminetetramethylenephosophonic acid lithium salt, diethylenetriaminepentaethylenephosophonic acid (DEPPO), triethylenetetraminehexaethylenephosphonic acid (TETHP), propanediaminetetraethylenephosphonic acid (PDTMP), etc. Among these, at least one kind selected from the group consisting of EDTPO, DEPPO, TETHP and PDTMP is particularly preferable.

An amount of the chelating agent or the salt thereof in a cleaning composition is, as lower limit, preferably not lower than 0.001% by weight, more preferably not lower than 0.005% by weight and most preferably not lower than 0.01% by weight, while as upper limit, preferably not higher than 20% by weight, more preferably not higher than 15% by weight and most preferably not higher than 10% by weight.

The alkaline compound is used to minimize variation of liquid property in cleaning performed as post-process such as polishing treatment, etching treatment and CMP treatment, and the like, using various alkaline agents. In view of easiness of composition handling, liquid property is preferably, as lower limit, not lower than 8, more preferably not lower than 9 and most preferably not lower than 10, while as upper limit, preferably not higher than 13, more preferably not higher than 12 and most preferably not higher than 11.

That is, in cleaning of semiconductor substrate surface which may have metal wiring on the surface, after treatment processes of polishing, etching, CMP, and the like, using various alkaline agents, too rapid change in pH at said substrate surface causes gelling of polishing compound remanded at the semiconductor substrate surface, which makes removal difficult. The alkaline compound is used to effectively suppress such the gelling and re-adsorption phenomenon of particles such as abrasive grains used in polishing onto silicon wafer surface due to being adjustable of zeta-potential of particles to minus side. It is also used to promote dissociation of a chelating agent and thus accelerate complex formation reaction with impurity metal.

An alkaline compound used for this purpose includes alkaline metal hydroxides such as potassium hydroxide, sodium hydroxide, lithium hydroxide, etc.; alkaline metal carbonate such as potassium hydrogen carbonate, potassium carbonate, sodium hydrogen carbonate, lithium hydrogen carbonate, lithium carbonate, etc.; aqueous ammonia solution or a salt thereof such as ammonium hydrogen carbonate, ammonium carbonate, etc.; piperazine (any of anhydrous or six hydrates), or a derivative thereof such as 1-(2-aminoethyl)piperazine, N-methylpiperazine, etc.; guanidine or a salt thereof such as guanidine carbonate, etc. They may be used alone or optionally in combination of two or more compounds.

Among these, particularly preferable one is an alkali metal hydroxide relatively often used as an alkaline polishing agent, etching agent, CMP treatment agent, etc. That is, by using these, generally used as an alkaline polishing agent, etching agent, CMP treatment agent, and the like before a cleaning process, generation of insoluble fine particles induced by variation of alkaline components can be suppressed and damage to substrate surface can be avoided, along with cleaning effect can be increased.

An amount of an alkaline compound in liquid cleaner is, although depending on type thereof, suitably selected from the range of, as lower limit, generally not lower than 0.1% by weight, more preferably not lower than 0.5% by weight and most preferably not lower than 1% by weight, while as upper limit, generally not higher than 20% by weight, more preferably not higher than 18% by weight and most preferably not higher than 16% by weight. In more specifically, in using potassium hydroxide, sodium hydroxide and guanidine, the lower limit is preferably not lower than 0.1% by weight, more preferably not lower than 0.5% by weight and further preferably not lower than 1% by weight, while the upper limit is preferably not higher than 6% by weight, more preferably not higher than 5% by weight and further preferably not higher than 4% by weight; and in using piperazine 6-hydrates, lower limit is preferably not lower than 0.1% by weight, more preferably not lower than 2% by weight and further preferably not lower than 5% by weight, while the upper limit is preferably not higher than 20% by weight, more preferably not higher than 18% by weight and further preferably not higher than 16% by weight.

To the liquid cleaner of the present invention, a suitable buffering agent may be added to maintain pH in the above-described range and such a buffering agent includes, for example, a boric acid or a good's buffer known as a biochemical buffering agent, and the like. A preferable good's buffer agent includes, for example, N,N-bis(2-hydroxyethyl)glycine (Bicine), N-cyclohexyl-3-aminopropane sulfonic acid (CAPS), N-cyclohexyl-2-hyrdoxy-3-aminopropane sulfonic acid (CAPSO) and N-cyclohexyl-2-aminoethane sulfonic acid (CHES), and a more preferable agent includes N-cyclohexyl-3-aminopropane sulfonic acid (CAPS) or N-cyclohexyl-2-aminoethane sulfonic acid (CHES).

These buffering agents are used by suitably mixed with the above-described alkaline compound (such as potassium hydroxide, sodium hydroxide, etc.) relevant to the present invention so that pH is in the above-described range (pH 8 to 13).

Concentration of the buffering agent in cleaning liquid of the present invention in such cases is, as lower limit, generally not lower than 0.01% by weight, preferably not lower than 0.05% by weight and more preferably not lower than 0.1% by weight, while as the upper limit, generally not higher than 10% by weight, preferably not higher than 5% by weight and more preferably not higher than 2.0% by weight.

Pure water is added to dissolve each component of the chelating agent or the salt thereof and the alkaline compound, and optionally, the buffering agent. Water with minimum impurity level is preferable so as not to inhibit action of other components. Specifically, pure water or ultra-pure water, prepared by removing foreign substances through a filter after removing impurity ion by an ion exchange resin, or distilled water, etc. is preferable The liquid cleaner of the present invention is supplied as a solution containing each component in the above-described concentration. This solution may be used for cleaning as it is, however, use by suitable dilution is preferable in view of balance between cost and cleaning effect. In use by such dilution, preferable volume ratio of the liquid cleaner of the present invention and pure water used for dilution (liquid cleaner: pure water) is 1:1 to 100, more preferably 1:1 to 80 and most preferably 1:1 to 50.

The liquid cleaner of the present invention is prepared by dissolving into water each component of the chelating agent or the salt thereof relevant to the present invention and the alkaline compound and optionally, the buffering agent.

A method for dissolving into water each component of the chelating agent or the salt thereof relevant to the present invention and the alkaline compound and optionally, the buffering agent is not especially limited as long as it is a method for providing a solution containing these components finally.

Specifically, these methods include, for example, (1) a method for directly adding into water the chelating agent or the salt thereof and the alkaline compound and optionally, the buffering agent relevant to the present invention, followed by stirring and dissolving, (2) a method for mixing a solution containing the chelating agent or the salt thereof relevant to the present invention and a solution containing the alkaline compound and, if necessary a solution containing the buffering agent, by separately dissolving into water the chelating agent or the salt thereof and the alkaline compound and optionally the buffering agent relevant to the present invention, or optionally, (3) a method for mixing a solution containing the chelating agent or the salt thereof and the buffering agent relevant to the present invention, obtained by directly adding into water the chelating agent or the salt thereof and the buffering agent relevant to the present invention, followed by stirring and dissolving, and a solution containing the alkaline compound relevant to the present invention obtained by separately dissolving into water, (4) a method for mixing a solution containing the alkaline compound and the buffering agent relevant to the present invention, obtained by directly adding into water the alkaline compound and the buffering agent relevant to the present invention, followed by stirring and dissolving, and a solution containing the chelating agent or the salt thereof relevant to the present invention obtained by separately dissolving into water and (5) a method for mixing a solution containing the chelating agent or the salt thereof and the alkaline compound relevant to the present invention obtained by directly adding into water the chelating agent or the salt thereof and the alkaline compound relevant to the present invention, followed by stirring and dissolving, and a solution containing the buffering agent relevant to the present invention obtained by separately dissolving into water.

The liquid cleaner of the present invention thus prepared is preferably subjected to filtration treatment, and the like before use.

A cleaning method using the liquid cleaner of the present invention may be any one as long as the liquid cleaner of the present invention can be contacted with semiconductor substrate surface and includes a method for dipping wafer into the liquid cleaner (dipping treatment), a method for showering or spraying the liquid cleaner, (single-wafer-based treatment), etc. Cleaning by the liquid cleaner of the present invention may be combined with a physical cleaning method such as brush-scrub and a megasonic, etc.

A specific method to combine with physical cleaning includes, for example, a method to apply a physical cleaning after providing the liquid cleaner of the present invention on the substrate surface by coating said liquid cleaner on the substrate surface, a method to apply a physical cleaning after providing the liquid cleaner of the present invention on the substrate surface by dipping the substrate in said liquid cleaner, then taking it out of said liquid cleaner, a method to apply a physical cleaning while a substrate is dipped in the liquid cleaner of the present invention, a method to apply a physical cleaning after providing the liquid cleaner of the present invention on the substrate surface by showering said liquid cleaner on the substrate surface, or, a method to apply a physical cleaning while the liquid cleaner of the present invention is showered on the substrate surface, etc.

A semiconductor substrate which may have metal wiring on the surface, suitably applied to cleaning by the liquid cleaner of the present invention includes, so to speak, silicon wafer, glass substrate for LCD and PDP, compound semiconductor substrate of such as GaAs and GaP, printed circuit board, etc.

Among them, the liquid cleaner of the present invention is useful to silicon wafer, glass substrate for LCD and PDP and compound semiconductor substrate of such as GaAs and GaP, in particular, to silicon wafer and compound semiconductor of such as GaAs and GaP. Further, the liquid cleaner of the present invention is useful to, among these substrates, substrate on which surface metal wiring is provided, such as copper, silver, aluminum, tungsten plug, chromium, gold, and the like, and in particular, to substrate on which surface copper or silver wiring is provided or further substrate on which surface copper wiring is provided and is most useful to semiconductor substrate on which copper wiring is provided.

The liquid cleaner of the present invention shows effective cleaning performance even at room temperature, however, cleaning effect increases at higher temperature. Therefore, the liquid cleaner may be used under suitably heated condition. In the case of use under heating, the liquid cleaner of the present invention is used generally at 30 to 80° C., preferably at 35 to 70° C. and more preferably at 40 to 60° C.

Further, the liquid cleaner of the present invention may contain various assisting components (such as surfactants, antiseptics, organic solvents, and the like) other than the above-described components, in the range not to impair effects of the present invention. However, it is not preferable to add hydrogen peroxide into the liquid cleaner of the present invention. That is, when semiconductor substrate on which metal wiring is provided is subjected to cleaning with a liquid cleaner containing hydrogen peroxide, said metal wiring surface is oxidized to induce increase in resistance or disconnection by corrosion, and the like in high probability and thus general applicability of the liquid cleaner of the present invention is not secured. Therefore, it is desirable not to add hydrogen peroxide into the liquid cleaner of the present invention.

The addition of surfactant(s) to the liquid cleaner of the present invention improves hydrophilicity of the liquid cleaner of the present invention to substrate surface, which in turn improves synergistic cleaning effect such as removal of metal impurity or abrasive grain components. A specific surfactant used for this purpose includes polyoxyethylene dodecyl phenyl ether, polyoxyethylene polyoxypropylene alkyl ether, polyoxyethylene acetylenic glycol ether, sodium dodecylbenzene sulfonate, potassium perfluoroalkyl sulfonate, sodium lauryl sulfate, etc. Use concentration thereof is, as lower limit, generally not lower than 0.01% by weight, preferably not lower than 0.05% by weight and more preferably not lower than 0.1% by weight, while as the upper limit, generally not higher than 5.0% by weight, preferably not higher than 2.0% by weight and more preferably not higher than 1.0% by weight.

As described above in detail, embodiment of the present invention provides the following effects.

The chelating agent or the salt thereof contained in the liquid cleaner has high ability to clean and remove metal impurity due to more easily formation of stable complex ion with metal impurity derived from transition metals, and the like, compared with a conventional chelating agent such as EDTA, etc. Therefore, in cleaning semiconductor substrate surface which may have metal wiring at the surface, it can reduce amount of metal impurity adhered to the surface.

Furthermore, because complex ion formed by reaction between metal impurity and the chelating agent or the salt thereof shows anionic nature, complex ion exhibits electrostatic repulsion against semiconductor substrate surface having negative zeta potential, which can suppress re-adherence of metal impurity or abrasive grain, and the like to substrate surface. This effect can suppress contamination of semiconductor substrate by impurity derived from transition metals such as Cu, Fe, Ni, and the like or alkaline earth metals such as Ca, Mg, etc.

Because the liquid cleaner of the present invention is adjusted to alkalescence and thus it can be adjusted to have the same liquid property as that of an alkaline polishing composition, etching composition and CMP composition, which then enables to minimize problems such as gelling of abrasive grains due to pH shock or roughness of substrate surface and thus can provide high cleaning effect.

Hereinbelow, examples and comparative examples are given below as detailed explanation of the present invention, but the present invention should not be restricted by these examples.

In examples, and the like below, concentration of impurity metal adsorbed and remained at silicon wafer surface was determined by recovery of impurity metal at silicon wafer surface by a dilute HF solution and graphite furnace atomic absorption spectrometry (hereinafter abbreviated as a dilute HF recovery-atomic absorption method). Furthermore, ultra-pure water was used in liquid preparation or analysis and HF was also ultra-high purity reagent.

Abbreviations used in examples, and the like hereinbelow are as follows:

EDTPO: ethylenediaminetetramethylenephosphonic acid
DEPPO: diethylenetriaminepentaethylenephosphonic acid
TETHP: triethylenetetraminehexaethylenephosphonic acid
PDTMP: propanediaminetetraethylenephosphonic acid
EDA: ethylenediamine
DETA: diethylenetriamine
EDTA: ethylenediaminetetraacetic acid
DTPA: diethylenetriaminepentaacetic acid
TMAH: tetramethylammonium hydroxide
CHES: N-cyclohexyl-2-aminoethane sulfonic acid
CAPS: N-cyclohexyl-3-aminopropane sulfonic acid

EXAMPLES

Example 1

To an aqueous solution of potassium hydroxide were added colloidal silica with particle diameter of not larger than 100 nm to be 15% by weight and 100 ppb of Fe, Cu, Al and Ca nitrates as metal impurities to prepare an alkaline composition for polishing. After polishing the surface of 6 inch P-type (100) silicon wafer with thus prepared contaminated polishing composition, the surface was rinsed with ultra-pure water. After the silicon wafer was dried with a spin dryer, residual volume of impurity metals adsorbed to the silicon wafer surface was measured by a dilute HF recovery-atomic absorption method.

Measurement results of adsorption at the silicon surface were: Fe of $5 \times 10^{13}$ atoms/cm$^2$, Cu of $2 \times 10^{13}$ atoms/cm$^2$, Al of $3 \times 10^{14}$ atoms/cm$^2$ and Ca of $8 \times 10^{12}$ atoms/cm$^2$.

Pure water was added to liquid cleaners compositions No. 1 to No. 6 of the present invention described in Table 1 to prepare a solution diluted to 10 to 100 times, in which the silicon wafer above prepared was dipped at 5° C. for 5 minutes for washing. After rinsing with ultra-pure water and drying with a spin dryer, Amounts of impurity metals remained at the silicon wafer surface was quantitatively measured by the above-described method. Results are shown in Table 1.

Comparative Example 1

Silicon wafer contaminated with Fe, Cu, Al and Ca, prepared similarly as in Example 1 was dipped in solution obtained by diluting to 10 to 100 times with adding a treatment agent having composition of No. 7 to No. 11 described in Table 1 to pure water, or ultra-pure water (No. 12) at 25° C. for 5 minutes for cleaning, followed by treatment similarly as in Example 1. Results are shown in Table 1.

TABLE 1

|  | No. | Chelating agent | Conc. (%) | Alkaline compound | Conc. (%) | Buffering agent | pH | Cleaning effect (atms/cm$^2$) | | | |
| --- | --- | --- | --- | --- | --- | --- | --- | --- | --- | --- | --- |
|  |  |  |  |  |  |  |  | Fe | Cu | Al | Ca |
| Example 1 | 1 | EDTPO | 1 | KOH | 4 | — | 13 | $3 \times 10^{10}$ | $8 \times 10^{10}$ | $5 \times 10^{10}$ | $6 \times 10^{10}$ |
|  | 2 | DEPPO | 10 | KOH | 3 | — | 10 | $6 \times 10^{9}$ | $3 \times 10^{10}$ | $7 \times 10^{10}$ | $3 \times 10^{10}$ |
|  | 3 | TETHP | 1 | KOH | 3 | — | 13 | $2 \times 10^{10}$ | $5 \times 10^{10}$ | $8 \times 10^{10}$ | $2 \times 10^{10}$ |
|  | 4 | PDTMP | 3 | KOH | 0.2 | CHES | 9 | $4 \times 10^{9}$ | $9 \times 10^{9}$ | $2 \times 10^{10}$ | $9 \times 10^{9}$ |

TABLE 1-continued

| | No. | Chelating agent | Conc. (%) | Alkaline compound | Conc. (%) | Buffering agent | pH | Cleaning effect (atms/cm²) Fe | Cu | Al | Ca |
|---|---|---|---|---|---|---|---|---|---|---|---|
| | 5 | EDTPO | 5 | KOH | 1 | — | 10 | $8 \times 10^{10}$ | $4 \times 10^{10}$ | $7 \times 10^{10}$ | $3 \times 10^{10}$ |
| | 6 | EDTPO | 5 | NAOH | 3 | Boric acid | 10 | $3 \times 10^{10}$ | $7 \times 10^{10}$ | $4 \times 10^{10}$ | $6 \times 10^{10}$ |
| Comparative Example 1 | 7 | EDA | 1 | KOH | 4 | — | 13 | $4 \times 10^{13}$ | $2 \times 10^{13}$ | $5 \times 10^{13}$ | $9 \times 10^{10}$ |
| | 8 | EDA | 1 | TMAH | 0.2 | CHES | 9 | $8 \times 10^{13}$ | $1 \times 10^{13}$ | $3 \times 10^{13}$ | $2 \times 10^{11}$ |
| | 9 | DETA | 3 | — | — | — | 10 | $6 \times 10^{12}$ | $1 \times 10^{13}$ | $2 \times 10^{14}$ | $3 \times 10^{11}$ |
| | 10 | — | — | TMAH | 0.4 | CHES | 9 | $8 \times 10^{12}$ | $3 \times 10^{13}$ | $3 \times 10^{14}$ | $8 \times 10^{10}$ |
| | 11 | — | — | KOH | 1 | — | 13 | $3 \times 10^{13}$ | $2 \times 10^{13}$ | $4 \times 10^{14}$ | $4 \times 10^{11}$ |
| | 12 | — | — | — | — | — | 7 | $5 \times 10^{13}$ | $2 \times 10^{13}$ | $3 \times 10^{14}$ | $8 \times 10^{12}$ |

As obvious from the results in Table 1, by cleaning with a liquid cleaner of the present invention, residual amount of impurity metal at the silicon wafer surface can significantly be reduced.

Example 2

In cleaning silicon wafer contaminated with Fe, Cu, Al and Ca, prepared similarly as in Example 1, by brush-scrub cleaning using a brush made of polyvinyl alcohol, a solution obtained by diluting to 10 to 100 times with adding the liquid cleaner of the present invention having each composition of No. 13 to No. 16 described in Table 2 to pure water was sprayed. Treatment temperature was at 25° C. and cleaning time was for 1 minute. After cleaning, silicon wafer was rinsed with ultra-pure water, followed by drying with a spin dryer, amounts of impurity metals remained at the silicon wafer surface was measured by the similar method as in Example 1. Results are shown in Table 2.

Comparative Example 2

In cleaning silicon wafer contaminated with Fe, Cu, Al and Ca, prepared similarly as in Example 1, by brush-scrub cleaning using a brush made of polyvinyl alcohol, a solution obtained by diluting to 10 to 100 times with adding a liquid cleaner having composition of No. 17 to No. 19 described in Table 2 to pure water or ultra-pure water (No. 20) was sprayed and treated similarly as in Example 2. Then, amounts of impurity metals remained at the silicon wafer surface was measured by similar method as in Example 1. Results are shown in Table 2.

As obvious from Table 2, also by physical cleaning using liquid cleaners of the present invention, residual amount of impurity metal can significantly be reduced.

Example 3

Cu wiring is used in the next generation semiconductor. In this case, to study damage of Cu wiring by cleaning agent used in cleaning based on Cu dissolution amount, liquid cleaners No. 21 to No. 24 of the present invention described in Table 3 was diluted to 10 to 100 times by adding pure water. Cu plated film was dipped in thus obtained solutions at 25° C. for 30 minutes to measure an amount of dissolved Cu ions by an ICP-AES method. Amounts of dissolved Cu are shown in Table 3. These amounts correspond to damage degree to Cu wiring.

Comparative Example 3

The liquid cleaners shown by No. 25 to No. 27 in Table 3 were prepared by replacing a chelating agent of the present invention with EDTA and DTPA, which were diluted 10 to 100 times by adding pure water. Cu plated film was dipped in thus prepared solutions at 25° C. for 30 minutes to measure amount of corroded and dissolved Cu ions by an ICP-AES method. Results are shown in Table 3.

TABLE 2

| | No. | Chelating agent | Conc. (%) | Alkaline compound | Conc. (%) | Buffering agent | pH | Cleaning effect (atms/cm²) Fe | Cu | Al | Ca |
|---|---|---|---|---|---|---|---|---|---|---|---|
| Example 2 | 13 | EDTPO | 0.5 | KOH | 2 | — | 13 | $3 \times 10^{9}$ | $8 \times 10^{8}$ | $5 \times 10^{9}$ | $6 \times 10^{9}$ |
| | 14 | DEPPO | 1 | KOH | 3 | — | 13 | $1 \times 10^{10}$ | $9 \times 10^{9}$ | $3 \times 10^{9}$ | $2 \times 10^{10}$ |
| | 15 | EDTPO | 1 | KOH | 0.1 | CHES | 9 | $1 \times 10^{9}$ | $3 \times 10^{9}$ | $8 \times 10^{9}$ | $6 \times 10^{9}$ |
| | 16 | TETHP | 2 | NaOH | 5 | — | 13 | $4 \times 10^{10}$ | $1 \times 10^{10}$ | $6 \times 10^{10}$ | $3 \times 10^{10}$ |
| Comparative Example 2 | 17 | EDA | 1 | KOH | 1 | — | 12 | $2 \times 10^{13}$ | $8 \times 10^{12}$ | $4 \times 10^{13}$ | $7 \times 10^{10}$ |
| | 18 | DETA | 1 | TMAH | 0.1 | CHES | 9 | $8 \times 10^{13}$ | $3 \times 10^{13}$ | $7 \times 10^{12}$ | $9 \times 10^{10}$ |
| | 19 | — | — | KOH | 1 | — | 13 | $8 \times 10^{13}$ | $3 \times 10^{13}$ | $7 \times 10^{12}$ | $9 \times 10^{10}$ |
| | 20 | — | — | — | — | — | 7 | $4 \times 10^{12}$ | $8 \times 10^{12}$ | $5 \times 10^{13}$ | $3 \times 10^{11}$ |

TABLE 3

| | No. | Chelating Agent | Conc. (%) | Alkaline compound | Conc. (%) | Buffering agent | pH | Amount of dissolved Cu (ppm) |
|---|---|---|---|---|---|---|---|---|
| Example 3 | 21 | EDTPO | 0.5 | KOH | 0.3 | — | 11 | 0.8 |
| | 22 | DEPPO | 1 | KOH | 3 | — | 13 | 0.5 |
| | 23 | DEPPO | 2 | KOH | 0.1 | CHES | 9 | 1.2 |
| | 24 | TETHP | 2 | NaOH | 5 | — | 13 | 1.5 |
| Comparative Example 3 | 25 | EDTA | 1 | KOH | 0.3 | CHES | 10 | 5.3 |
| | 26 | EDTA | 2 | TMAH | 1 | — | 13 | 5.8 |
| | 27 | DTPA | 2 | TMAH | 1 | — | 13 | 4.1 |

As obvious from Table 3, a liquid cleaner of the present invention provides less amount of dissolved Cu than cleaning agents using EDTA or DTPA which is the conventional chelating agents and thus less damage to Cu wiring.

INDUSTRIAL APPLICABILITY

A liquid cleaner of the present invention is composed of as described above, therefore it provides effects of efficient removal of fine particles or impurities derived from various metals at the semiconductor substrate surface, even when used after a process adopting an alkaline polishing agent or alkaline etching liquid, without generating problems of causing difficult-to-remove gelled particles at the substrate surface or easy generation of rough semiconductor substrate surface.

The invention claimed is:

1. A liquid cleaner for a semiconductor substrate on which metal wiring may be provided, consisting of each component of a) a chelating agent or a salt thereof shown by the following general formula (1), a hydroxide of an alkaline metal and pure water, or b) a chelating agent or a salt thereof shown by the following general formula (1), a hydroxide of an alkaline metal, pure water and a buffering agent, wherein pH is 8 to 13

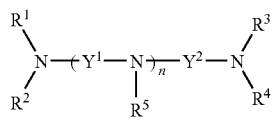
(1)

(wherein, $Y^1$ and $Y^2$ are lower alkylene groups, n is an integer of 0 to 4, at least 4 of $R^1$ to $R^4$ and n $R^5$s are alkyl groups having phosphonic acid group(s) and the rest are alkyl groups).

2. The liquid cleaner according to claim 1, wherein, $Y^1$ and $Y^2$ in the chelating agent shown by the general formula (1) are alkylene groups having 1 to 4 carbon atoms and alkyl groups in alkyl groups which may have phosphonic acid group(s) relevant to $R^1$ to $R^4$ and n $R^5$s are alkyl groups having 1 to 4 carbon atoms.

3. The liquid cleaner according to claim 1, wherein the chelating agent or a salt thereof is at least one kind selected from the group consisting of ethylenediaminetetraethylenephosphonic acid, ethylenediaminetetraethylenephosphonic acid ammonium salt, ethylenediaminetetraethylenephosphonic acid potassium salt, ethylenediaminetetraethylenephosphonic acid sodium salt, ethylenediaminetetraethylenephosphonic acid lithium salt, ethylenediaminetetramethylenephosphonic acid, ethylenediaminetetramethylenephosphonic acid ammonium salt, ethylenediaminetetramethylenephosphonic acid potassium salt, ethylenediaminetetramethylenephosphonic acid sodium salt, ethylenediaminetetramethylenephosphonic acid lithium salt, diethylenetriaminepentaethylenephosphonic acid, diethylenetriaminepentamethylenephosphonic acid, diethylenetriaminepentamethylenephosphonic acid ammonium salt, diethylenetriaminepentamethylenephosphonic acid potassium salt, diethylenetriaminepentamethylenephosphonic acid sodium salt, diethylenetriaminepentamethylenephosphonic acid lithium salt, triethylenetetraminehexaethylenephosphonic acid, triethylenetetraminehexamethylenephosphonic acid, triethylenetetraminehexamethylenephosphonic acid ammonium salt, triethylenetetraminehexamethylenephosphonic acid potassium salt, triethylenetetraminehexamethylenephosphonic acid sodium salt, triethylenetetraminehexamethylenephosphonic acid lithium salt, propanediaminetetraethylenephosphonic acid, propanediaminetetramethylenephosphonic acid, propanediaminetetramethylenephosphonic acid ammonium salt, propanediaminetetramethylenephosphonic acid potassium salt, propanediaminetetramethylenephosphonic acid sodium salt and propanediaminetetramethylenephosphonic acid lithium salt.

4. The liquid cleaner according to claim 1, wherein the buffering agent is one selected from boric acid and a good's buffer.

5. A method for cleaning a semiconductor substrate, which comprises the semiconductor substrate, on which metal wiring may be provided, is cleaned with a liquid cleaner comprising each component of a) a chelating agent or a salt thereof shown by the following general formula (1), a hydroxide of an alkaline metal and pure water, or b) a chelating agent or a salt thereof shown by the following general formula (1), a hydroxide of an alkaline metal, pure water and a buffering agent, wherein pH is 8 to 13

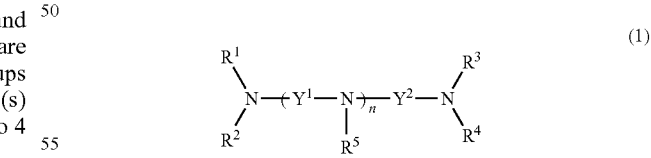
(1)

(wherein, $Y^1$ and $Y^2$ are lower alkylene groups, n is an integer of 0 to 4, at least 4 of $R^1$ to $R^4$ and n $R^5$s are alkyl groups having phosphonic acid group(s) and the rest are alkyl groups).

6. The liquid cleaner according to claim 1, wherein the hydroxide of the alkaline metal is at least one selected from the group consisting of potassium hydroxide, sodium hydroxide and lithium hydroxide.

* * * * *